United States Patent
Jeong

(10) Patent No.: US 8,010,239 B2
(45) Date of Patent: Aug. 30, 2011

(54) PARTIAL DISCHARGE COUNTER FOR DIAGNOSIS OF GAS INSULATED SWITCHGEAR

(75) Inventor: Jae Kee Jeong, Daejeon (KR)

(73) Assignee: Hanbit EDS Co., Ltd., Daejeon (KR)

( * ) Notice: Subject to any disclaimer, the term of this patent is extended or adjusted under 35 U.S.C. 154(b) by 257 days.

(21) Appl. No.: 12/549,506

(22) Filed: Aug. 28, 2009

(65) Prior Publication Data
US 2010/0324746 A1 Dec. 23, 2010

(30) Foreign Application Priority Data
Jun. 19, 2009 (KR) .................. 10-2009-0054878

(51) Int. Cl.
G05D 3/12 (2006.01)
G05D 5/00 (2006.01)
G05D 9/00 (2006.01)
G05D 17/00 (2006.01)
G05D 11/00 (2006.01)
G01R 31/08 (2006.01)
G01R 31/28 (2006.01)
G01R 31/11 (2006.01)

(52) U.S. Cl. ........ 700/292; 700/293; 700/294; 324/520; 324/522; 324/523; 324/533; 324/536

(58) Field of Classification Search .......... 700/292–294; 324/424, 520, 522–523, 533, 536; 702/57–58
See application file for complete search history.

(56) References Cited

U.S. PATENT DOCUMENTS

| | | | | |
|---|---|---|---|---|
| 4,446,420 A * | 5/1984 | Drouet | ...... | 324/522 |
| 5,124,687 A * | 6/1992 | Okumura et al. | ...... | 340/647 |
| 5,200,737 A * | 4/1993 | Konishi et al. | ...... | 340/644 |
| 5,475,312 A * | 12/1995 | Sedding et al. | ...... | 324/536 |
| 6,255,808 B1 * | 7/2001 | Hucker | ...... | 324/122 |
| 6,445,189 B1 * | 9/2002 | Pakonen et al. | ...... | 324/536 |
| 7,180,303 B1 * | 2/2007 | Chen et al. | ...... | 324/536 |
| 7,388,384 B2 * | 6/2008 | Kato et al. | ...... | 324/536 |
| 2003/0214307 A1 * | 11/2003 | Kang et al. | ...... | 324/536 |
| 2008/0103712 A1 * | 5/2008 | Kim et al. | ...... | 702/67 |
| 2009/0027062 A1 * | 1/2009 | Maruyama et al. | ...... | 324/544 |
| 2010/0259275 A1 * | 10/2010 | Grieshaber et al. | ...... | 324/522 |

* cited by examiner

*Primary Examiner* — Ronald Hartman, Jr.
(74) *Attorney, Agent, or Firm* — Birch, Stewart, Kolasch & Birch, LLP

(57) ABSTRACT

The present invention relates generally to a partial discharge counter for the diagnosis of a GIS. The partial discharge counter includes a partial discharge detection sensor for detecting a partial discharge. A first surge inflow prevention circuit separates a surge signal from an output terminal of the partial discharge detection sensor. A channel 1 frequency conversion module forms a low-frequency signal. A noise detection sensor detects noise. A second surge inflow prevention circuit separates a surge signal from an output terminal of the noise detection sensor. A channel 2 frequency conversion module forms a low-frequency signal. An ADC circuit generates partial discharge data and noise data. A synchronization device enables the partial discharge data and the noise data to be output in synchronization with frequency of the phase voltage. A digital signal processing unit counts a number of times the partial discharge occurs. Counting units display a count value.

7 Claims, 8 Drawing Sheets

US 8,010,239 B2

PARTIAL DISCHARGE COUNTER FOR DIAGNOSIS OF GAS INSULATED SWITCHGEAR

BACKGROUND OF THE INVENTION

1. Field of the Invention

The present invention relates generally to a Partial Discharge (PD) counter for the diagnosis of a Gas Insulated Switchgear (GIS), which diagnoses a partial discharge using a partial discharge detection sensor in the GIS playing an important role among the power devices of a substation.

More particularly, the present invention relates to a partial discharge counter for the diagnosis of a GIS, which has a function of preventing malfunction from occurring due to external noise.

2. Description of the Related Art

A GIS system is configured such that SF6 gas is inserted into and sealed in a metal box and switches, such as a circuit breaker, a disconnector and a ground switch, and a three-phase (A, B and C phases) bus bar are fixedly installed in the metal box.

Such a GIS system has an advantage in that it is not easily influenced by changes in an external environment such as the strike of a thunderbolt because the GIS system is contained in the metal box, as well as structural advantages in that the GIS system is excellent in appearance, has a long lifespan owing to excellent insulating performance and is structurally optimized to enable the reduction of a substation.

However, a GIS system has disadvantages in that it is difficult to anticipate failures in advance and visibly detect such failures and in that once a failure occurs, it expands to become a large-scale failure.

Therefore, the development of a preventive diagnosis system for detecting failures in advance and taking preemptive action has been conducted, and a method of anticipating and measuring a partial discharge is determined to be the most influential method and has been widely used worldwide.

Meanwhile, a conventional online partial discharge diagnosis system is convenient in that it is possible to determine a partial discharge and continuously notify a substation equipment operator of the degree of the partial discharge, so that this system has been selectively applied to some important substations which require relatively accurate diagnosis. However, it is generally difficult to extensively apply the conventional system because the price thereof is so high that it amounts to several tens of % of the total cost of substation equipment.

In consideration of this disadvantage of the high price of the conventional online partial discharge diagnosis system, a portable GIS partial discharge diagnosis device has been used as an alternative conventional technology.

Although such a portable GIS partial discharge diagnosis device is not problematic from the standpoints of accuracy and the detection of a GIS partial discharge, there are no measures capable of processing a GIS partial discharge occurring at times other than the time of measurement because the monitoring of a partial discharge is only possible when a measurement is being conducted.

SUMMARY OF THE INVENTION

Accordingly, the present invention has been made keeping in mind the above conventional problems in which an online partial discharge diagnosis system is expensive and a portable GIS partial discharge diagnosis device cannot perform ordinary monitoring, and an object of the present invention is to provide a partial discharge counter which can be used for an economical GIS diagnosis device using the characteristics of a GIS partial discharge.

In particular, since the partial discharge counter of the present invention includes a function of preventing malfunction attributable to external noise, a partial discharge counter robust to external noise is provided.

In order to accomplish the above object, the present invention provides a partial discharge counter device for diagnosis of a Gas Insulated Switchgear (GIS), the device measuring a number of times a partial discharge occurs in the GIS to perform diagnosis of insulation of the GIS, comprising a partial discharge detection sensor for detecting a partial discharge attributable to an abnormality inside the GIS when the partial discharge occurs; a first surge inflow prevention circuit for separating a surge signal from an output terminal of the partial discharge detection sensor, thus protecting the counter device from the surge signal; a channel 1 frequency conversion module for extracting a low-frequency component from a high-frequency output signal detected by the partial discharge detection sensor and forming a low-frequency signal; a noise detection sensor for detecting noise when the noise occurs outside the GIS; a second surge inflow prevention circuit for separating a surge signal from an output terminal of the noise detection sensor, thus protecting the counter device from the surge signal; a channel 2 frequency conversion module for extracting a low-frequency component from a high-frequency output signal detected by the noise detection sensor and forming a low-frequency signal; an Analog-Digital Counter (ADC) circuit for converting analog signals, output from the channel 1 frequency conversion module and the channel 2 frequency conversion module, into digital signals, and generating partial discharge data and noise data; a synchronization device for dropping a phase voltage and converting the dropped phase voltage into a square wave signal, thus enabling the partial discharge data and the noise data, that is, output signals of the ADC circuit, to be output in synchronization with a frequency of the phase voltage; a digital signal processing unit for comparing the synchronized partial discharge data and the noise data, determining whether a partial discharge has actually occurred, and counting a number of times the partial discharge occurs only when the partial discharges have actually occurred and exceed a set value; and counting units for displaying a count value obtained by the digital signal processing unit so as to allow a user to view the count value.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
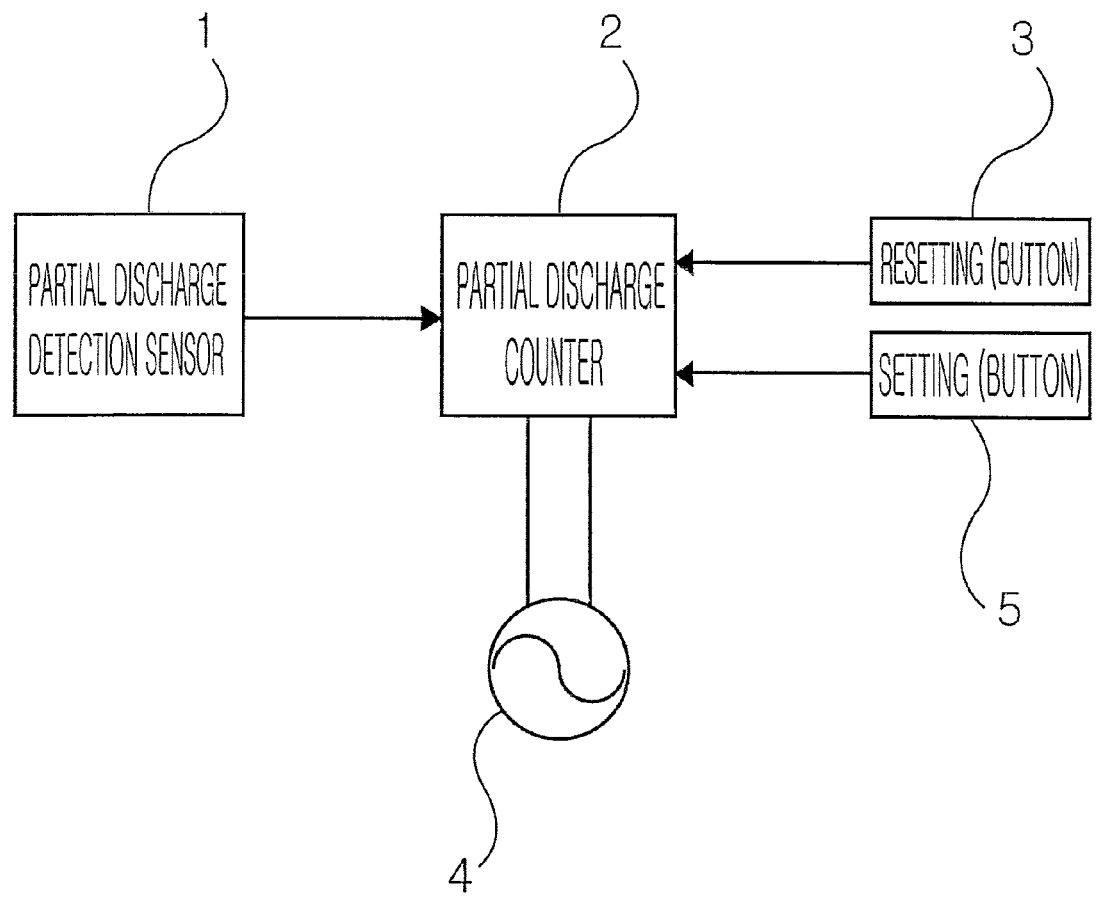
FIG. 1 is a diagram showing the overall construction of a partial discharge counter according to the present invention.

For easy understanding of the construction and operation of a partial discharge counter according to the present invention, the characteristics of a GIS partial discharge will be described from the standpoint of diagnosis below.

First, even when a GIS partial discharge is detected, it does not rapidly progress and cause an accident within a period of a few minutes or a few hours. Occasionally, even in the situation in which a partial discharge occurs, equipment may normally operate for several years without any accident attributable to it. The reason for this is that the progress of a partial discharge occurs gradually, as in the case of dielectric breakdown.

Second, during the progress of a GIS partial discharge following its detection, an accident may occur. Therefore, the detection of both the intensity of a partial discharge and an increase in the number of times a partial discharge occurs is the point of GIS diagnosis using the partial discharge.

Third, ordinary monitoring is required because the time at which a partial discharge occurs in the GIS cannot be anticipated.

Fourth, a GIS partial discharge occurs in synchronization with the frequency of a phase voltage. That is, a partial discharge attributable to an abnormality in the GIS occurs in a regular pattern for each phase of the frequency of the phase voltage. These pattern characteristics may be of great help in discriminating the phase patterns from the phase patterns of external random noise.

Next, the characteristics of the partial discharge counter according to the present invention will be described.

First, the partial discharge counter of the present invention may count the number of times a partial discharge occurs using an internal partial discharge detection sensor included in the GIS, or using an external sensor implemented by attaching a separate external partial discharge detection sensor outside the GIS.

Second, the partial discharge counter of the present invention detects and counts only signals occurring in synchronization with the frequency of a phase voltage. That is, the partial discharge counter can discriminate a partial discharge from random noise originating from external sources by counting only signals synchronized with the frequency of the phase voltage. For this function, the phase voltage is externally supplied. Therefore, since external connection for installing the partial discharge counter according to the present invention at a work site needs only two phase voltage supply lines and one connector for connecting the sensor to the counter, the installation of the partial discharge counter is greatly simplified.

Third, the partial discharge counter has a function of setting a counting level required to adjust the sensitivity of detection of a GIS partial discharge signal. Actually, in the early stages of a partial discharge in the GIS, the partial discharge intermittently occurs, and thereafter it continuously occurs as the partial discharge progresses. In this case, when an initially set value is maintained, counting is intermittently performed in the early stages, and is then continuously performed as the partial discharge progresses. In order to prevent this continuous counting, a function of adjusting the set value is provided, and a relevant sensor may be managed whenever an operator increases a counting level.

Fourth, the partial discharge counter has two counting units. One is an accumulative counting unit for counting and accumulating the numbers of times a partial discharge occurs, and the other is a reset counting unit for performing counting for a predetermined period. By using the two counting units, whether a GIS partial discharge is progressing and whether the degree of a GIS partial discharge is increasing may be determined, with the result that the advantage of an online device may be achieved.

Fifth, when signals occurring in synchronization with the frequency of the phase voltage are counted, a partial discharge occurs about 50 to 60 times per second and occurs about 3000 to 3600 times per minute if counting is performed at every time (this differs according to the frequency of the phase voltage). The object of the present invention is to notify an operator of the location at which an abnormality occurs so as to continuously manage the location of the abnormality, so that a function of setting a reference density level is provided. This function is implemented in such a way that when the reference density level is set to 100 times, a count value is increased by 1 whenever a partial discharge occurs 100 times.

Sixth, since the partial discharge counter of the present invention can prevent malfunction attributable to external noise from occurring, the number of times a partial discharge occurs can be accurately counted.

Hereinafter, the construction and operation of the partial discharge counter according to the present invention having the above technical characteristics will be described in detail with reference to the attached drawings.

As shown in FIG. 1, a partial discharge detection sensor 1 for detecting a partial discharge at a work site monitors the inside of a GIS and transmits a detected partial discharge value attributable to an abnormality to a partial discharge counter 2. The partial discharge counter 2 synchronizes the detected partial discharge value with a phase voltage 4 supplied from the work site, compares the synchronized partial discharge value with a value set using a setting button 5, performs counting if the result of the comparison satisfies relevant conditions, and displays a count value on counting units. The display of the counting units is initialized by a resetting button 3.

Figure 2:
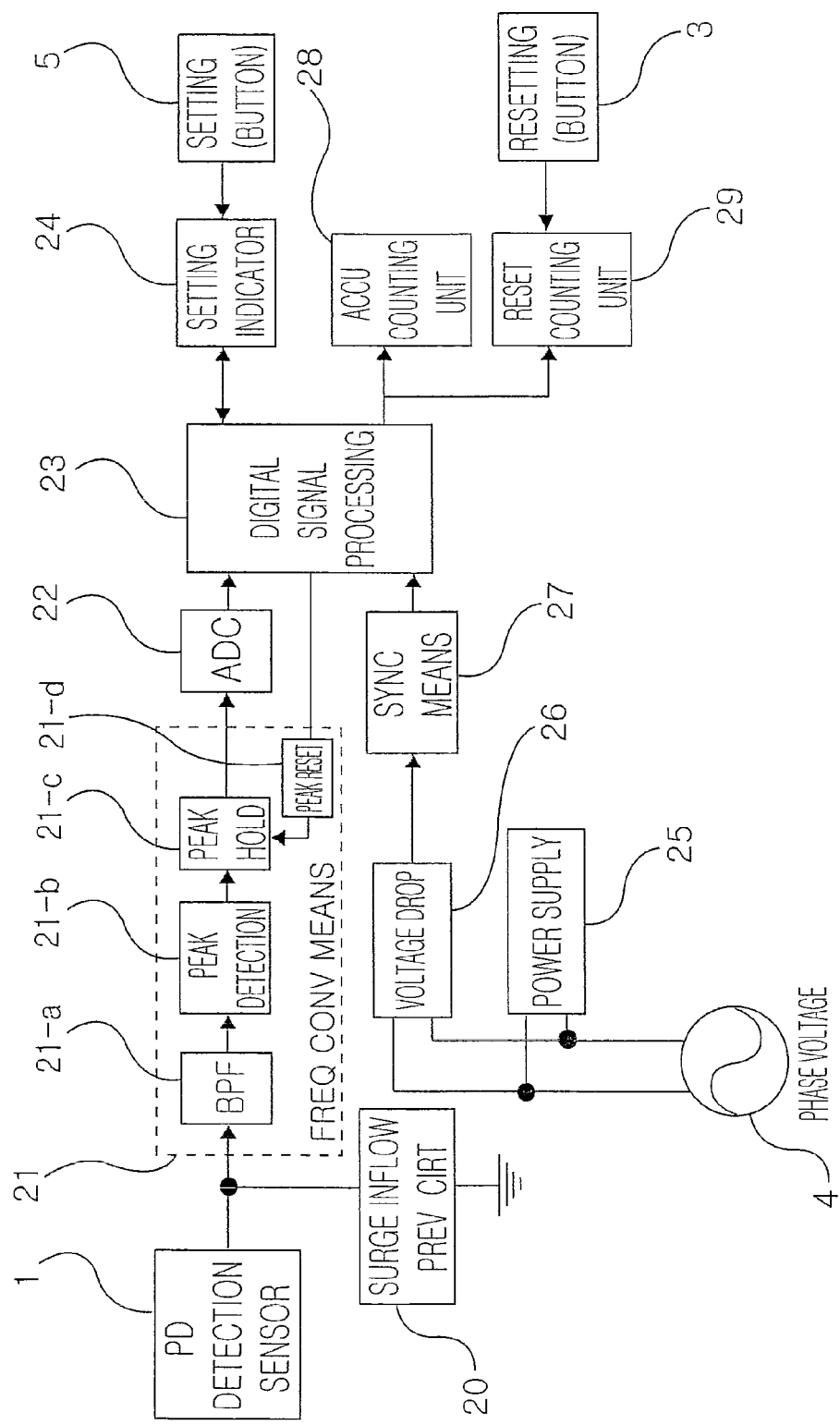
FIG. 2 is a diagram showing the detailed construction of a partial discharge counter according to an embodiment of the present invention.

Referring to FIG. 2, the detailed construction and operation of the partial discharge counter according to the present invention will be described below.

When a partial discharge is caused by an abnormality of the inside of the GIS, the partial discharge is emitted in the form of an electromagnetic signal, and the discharge frequencies of this signal include all frequency components. Since the partial discharge can be effectively detected at frequencies in the Ultra-High Frequency (UHF) band, the partial discharge detection sensor 1 is designed to detect a partial discharge in the UHF band. The types of partial discharge detection sensors are classified into an internal partial discharge detection sensor and an external partial discharge detection sensor. The internal partial discharge detection sensor is configured to be attached to a GIS pipe when a GIS is manufactured. The external partial discharge detection sensor is applied to GIS equipment having no internal partial discharge detection sensor, and is attached through a spacer. Since the GIS pipe is made of a metal material, an electromagnetic signal caused by the internal discharge of the GIS cannot flow out of the GIS pipe. In contrast, since the spacer which is a connection part for the GIS pipe is made of an epoxy material, it is only a structure out of which the electromagnetic signal can flow.

Furthermore, a surge signal caused by a thunderbolt or a ground fault accident is a short-pulse signal having a wave front and tail ranging from about 8 to 20 μs. Since this surge signal is not a signal caused by the partial discharge of the GIS, it must be separated from a partial discharge signal and must not flow into the circuit of the partial discharge counter 2. In order to perform this function, a surge inflow prevention circuit 20 is disposed at the first stage of the partial discharge counter 2.

Meanwhile, since a signal output from the partial discharge detection sensor 1 is a high-frequency signal in the UHF band, it is difficult for a commonly used Analog-Digital Conversion (ADC) circuit 22 to process the output signal. Although there is an ADC capable of high-speed processing, it is expensive due to ordered production and has a complicated structure requiring a peripheral control circuit. Therefore, the low-frequency conversion means 21 functions to convert a high-frequency signal into a low-frequency signal of several tens of kHz so that the signal can be processed by a general-purpose ADC 22 which is easily obtained and widely used.

That is, the signal output from the partial discharge detection sensor passes through a Band Pass Filter (BPF) 21-a so as to extract a low-frequency signal such as a surge signal. The signal having passed through the BPF 21-a forms a transition curve following only peak values of an original signal through a peak detection circuit 21-b. Such a transition curve has a low frequency signal of several tens of kHz. The peak values of the low-frequency signal are held by a peak-hold circuit 21-c.

Such a peak-held signal 21-c is converted into a digital signal by the ADC circuit 22. When the conversion has been completed by the ADC circuit 22, a digital signal processing unit 23 provides a reset signal to a peak reset circuit 21-d, thus allowing the peak-held signal to be reset by the peak reset circuit 21-d. This signal processing (band pass filtering 21-a, peak detection 21-b, peak-holding 21-c, ADC 22, peak resetting 21-d) is repeatedly performed 128 times in each period of a synchronization signal.

Further, a synchronization means 27 functions to synchronize partial discharge data with a synchronizing pulse. The synchronizing pulse is implemented using the phase voltage 4 supplied from the work site. The phase voltage 4 typically ranges from several tens of V to several hundreds of V because a secondary side voltage of a voltage divider (Potential Transformer: PT) installed in the work site of the substation is used as the phase voltage 4. When this voltage is directly supplied into a circuit, the devices of the circuit may be broken down, and thus the voltage is converted into a Transistor-Transistor Logic (TTL) level signal that may be processed by the circuit through a voltage drop circuit 26. This TTL level signal is a synchronizing pulse output as a 0-5V peak square wave signal. Through the use of the synchronizing pulse, the synchronization means 27 transmits the partial discharge data to the digital signal processing unit 23 while synchronizing the partial discharge data with the synchronizing pulse.

Further, after reading the partial discharge data converted 128 times by the ADC circuit 22 in each period of the phase voltage frequency, the digital signal processing unit 23 initializes the peak-held signal to 0V by applying 128 times a reset pulse to the peak reset circuit 21-d. The value of the partial discharge data synchronized with the phase voltage frequency is compared with the value set by a setting device 5. When the value of the partial discharge data exceeds the set value, counting is performed and a count value is displayed on counting units 28 and 29. The set value is input using the external button of the setting device 5, and the set value and the count value are stored in the setting device 5.

The partial discharge counter of the present invention enables two types of setting means to be implemented at the time of counting a number of times partial discharge data occurs. One type is a reference level setting means for setting a reference level for the partial discharge and counting only signals equal to or greater than the reference level. The other type is a reference density setting means for setting a specific number of times partial discharge data, equal to or greater than the reference level, occurs to a count value '1'.

The counting units may include an accumulative counting unit 28 and a reset counting unit 29. The former has a structure of accumulating count values from the time point of initial installation and preventing records of the count values from being eliminated. The latter has a structure enabling initialization of the count values accumulated for a predetermined period using the resetting button 3 outside the partial discharge detection sensor.

A setting indicator 24 is a device for indicating the set reference level and the set reference density value for partial discharge. This is implemented in the form of a Liquid Crystal Display (LCD), so that an operator manually manipulates and sets respective values. Further, the setting indicator 24 indicates frequency information and real-time data values as well as the set values.

Meanwhile, in FIGS. 1 and 2, one partial discharge counter analyzes the pattern of a partial discharge signal and performs a counting operation using one input signal channel. When one input signal channel is used in this way, there is a disadvantage because, if a signal having a pattern similar to the pattern of the partial discharge signal externally flows into the equipment, the partial discharge counter erroneously assumes that partial discharge is occurring in the equipment, and then performs a counting operation.

Figure 3:
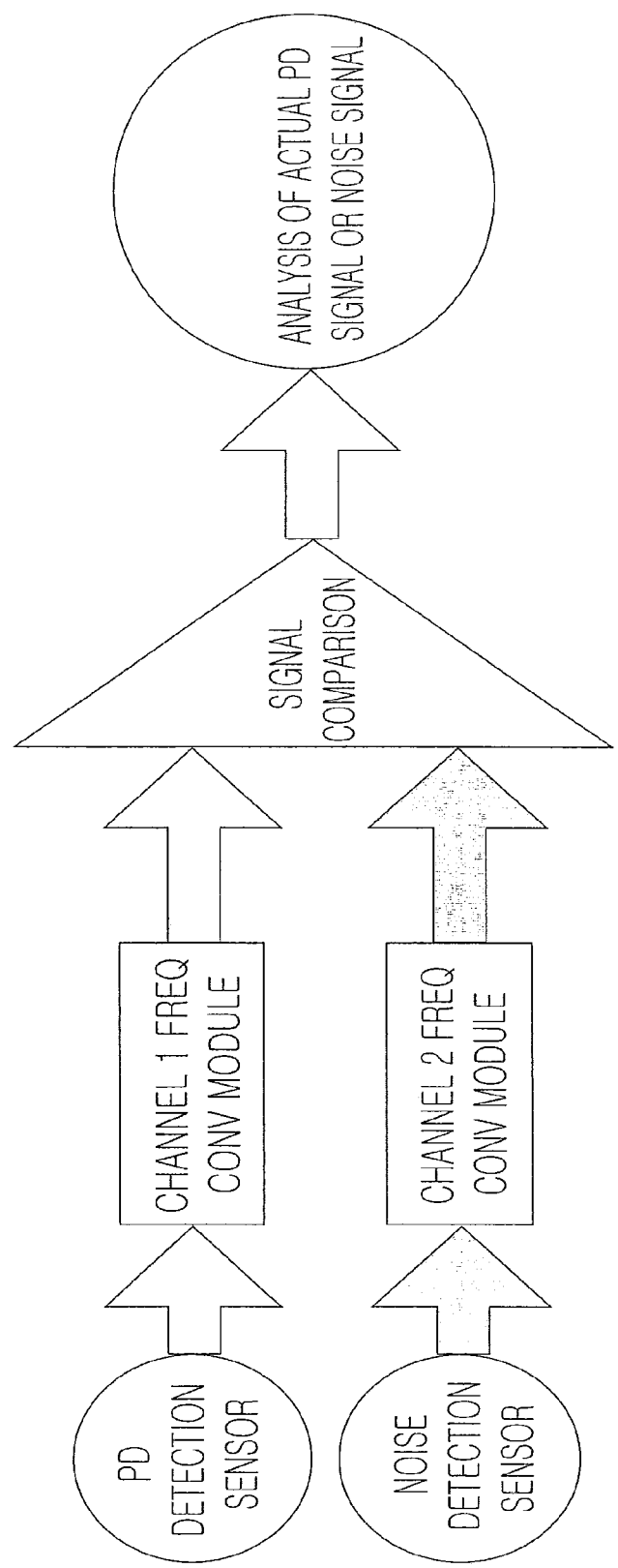
FIG. 3 is a diagram showing the principle of a partial discharge counter according to another embodiment of the present invention.

In order to solve the problems of FIGS. 1 and 2, another embodiment of the present invention is implemented such that, as shown in FIG. 3, through the use of two input signal channels, a partial discharge is detected in a first channel using the method of FIG. 1 or 2 by a partial discharge detection sensor installed inside the equipment, and noise is detected in a second channel by a noise detection sensor installed outside the equipment, and such that the partial discharge is compared with the noise, and thus whether a partial discharge has actually occurred or whether a noise signal flows into the equipment is determined.

Hereinafter, a detailed method of implementing another embodiment of the present invention, as shown in FIG. 3, will be described in brief with reference to FIG. 4.

Figure 4:
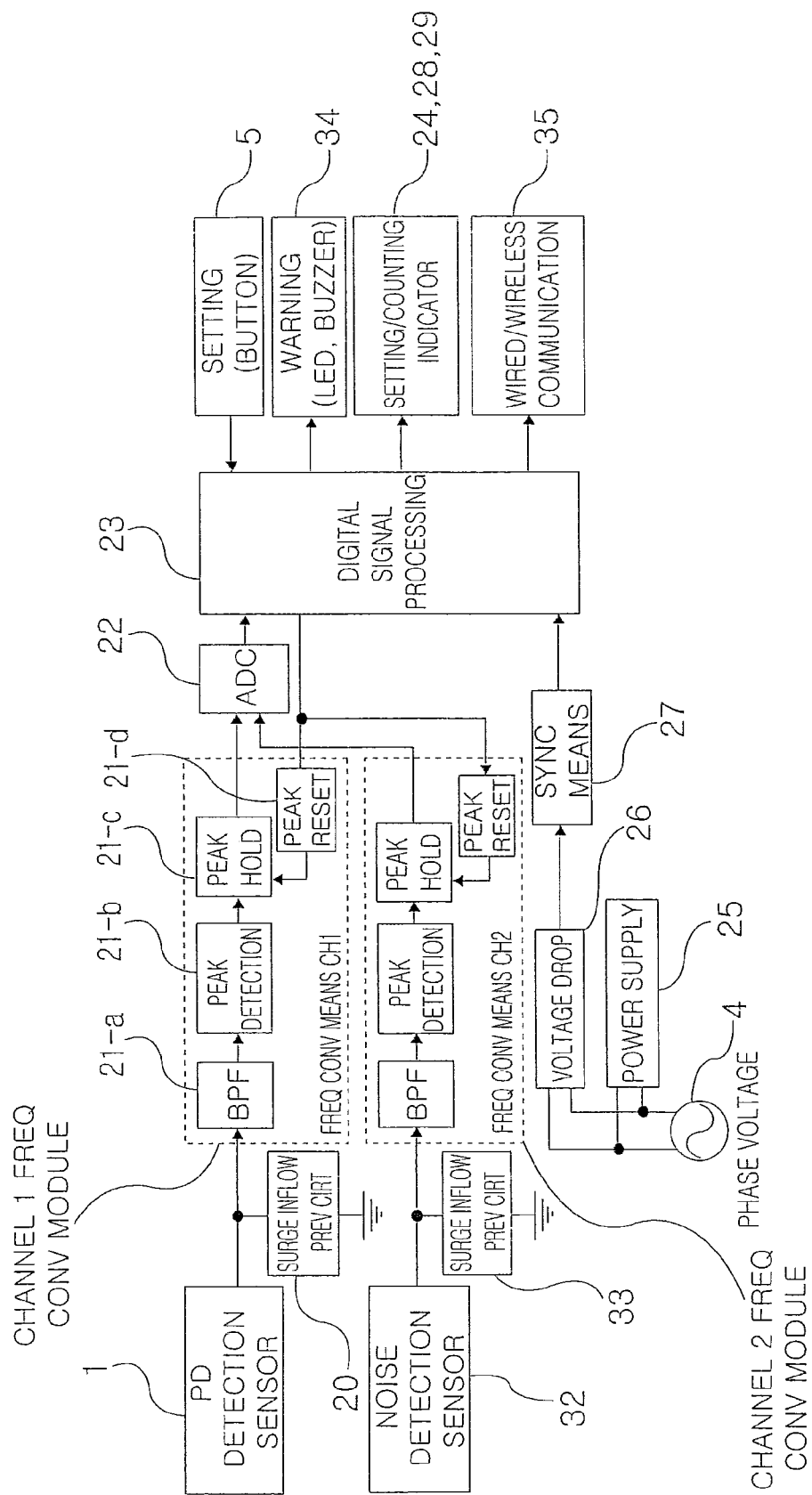
FIG. 4 is a diagram showing the detailed construction of a partial discharge counter according to the another embodiment of the present invention.

As shown in FIG. 4, a surge inflow prevention circuit 20 and a channel 1 frequency conversion module 30 which are connected to a partial discharge detection sensor 1 installed inside the equipment, and a surge inflow prevention circuit 33 and a channel 2 frequency conversion module 31 which are connected to a noise detection sensor 32 installed outside the equipment are identical to those of FIG. 2, and thus a detailed description of the construction and operation of these circuits will be omitted.

A digital signal processing unit 23 compares partial discharge data received through the channel 1 frequency conversion module 30 with noise data received through the channel 2 frequency conversion module 31. When the two patterns are identical to each other, it is considered that noise actually flows into the equipment, and thus the digital signal processing unit 23 does not perform an operation of counting the number of times a partial discharge occurs. In contrast, when the two patterns are not identical to each other, it is considered that noise does not flow into the equipment, and thus the digital signal processing unit 23 performs an operation of counting the number of times a partial discharge occurs.

Meanwhile, it is also possible to generate a warning through a Light Emitting Diode (LED) or a buzzer as in the case of the warning function 34 of FIG. 4 so that the warning can be provided to a user because a partial discharge count value exceeds a set value, or due to other reasons.

Further, it is possible to additionally provide a wired/wireless communication module 35 to transmit the count value to a remote monitoring room via a wired or wireless connection.

Next, a method of installing the partial discharge counter 2 of FIGS. 1 and 2 will be described with reference to FIGS. 5 and 6.

Figure 5:
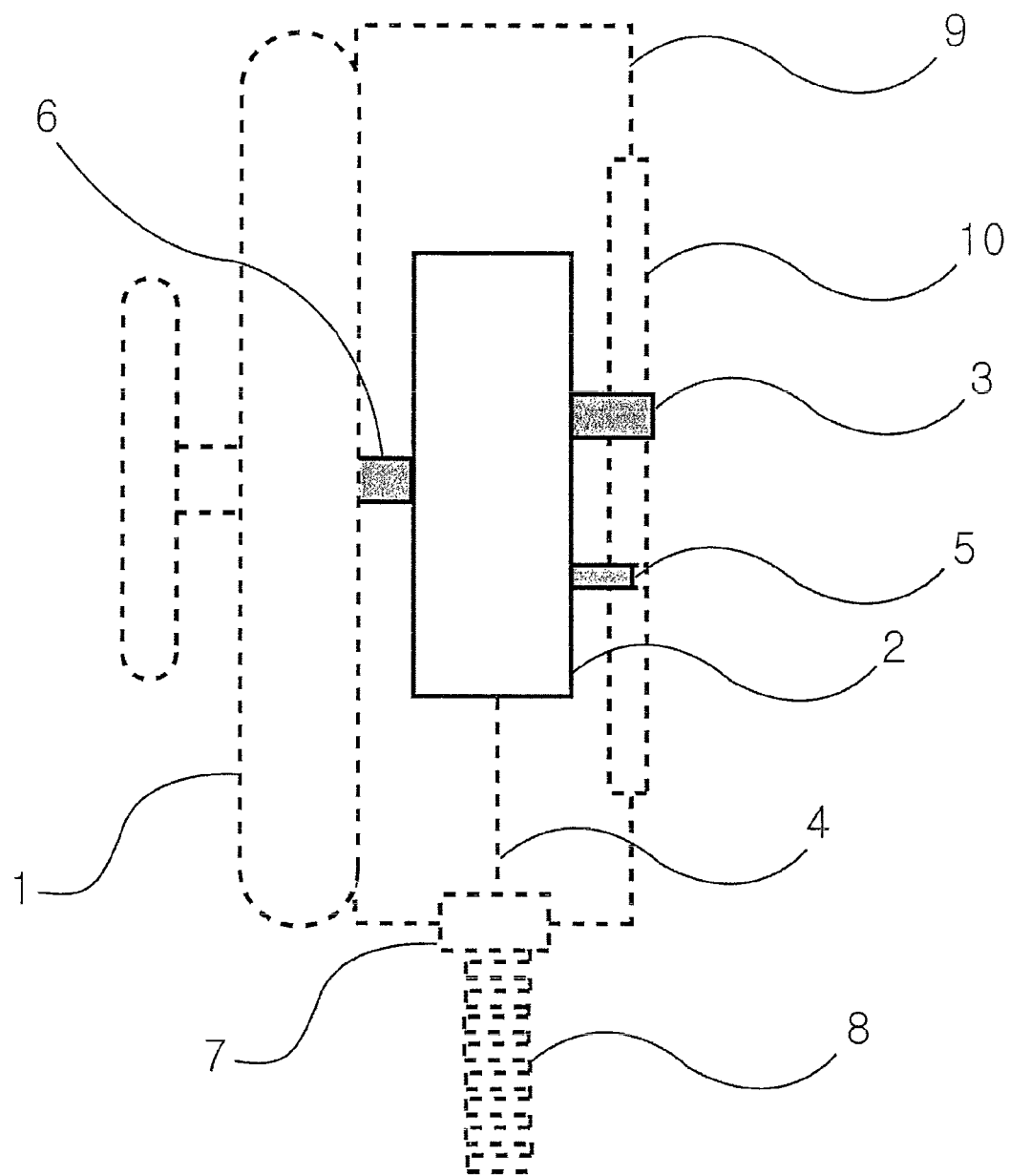
FIG. 5 is a side view showing the installation of the partial discharge counter of FIGS. 1 and 2.
Figure 6:
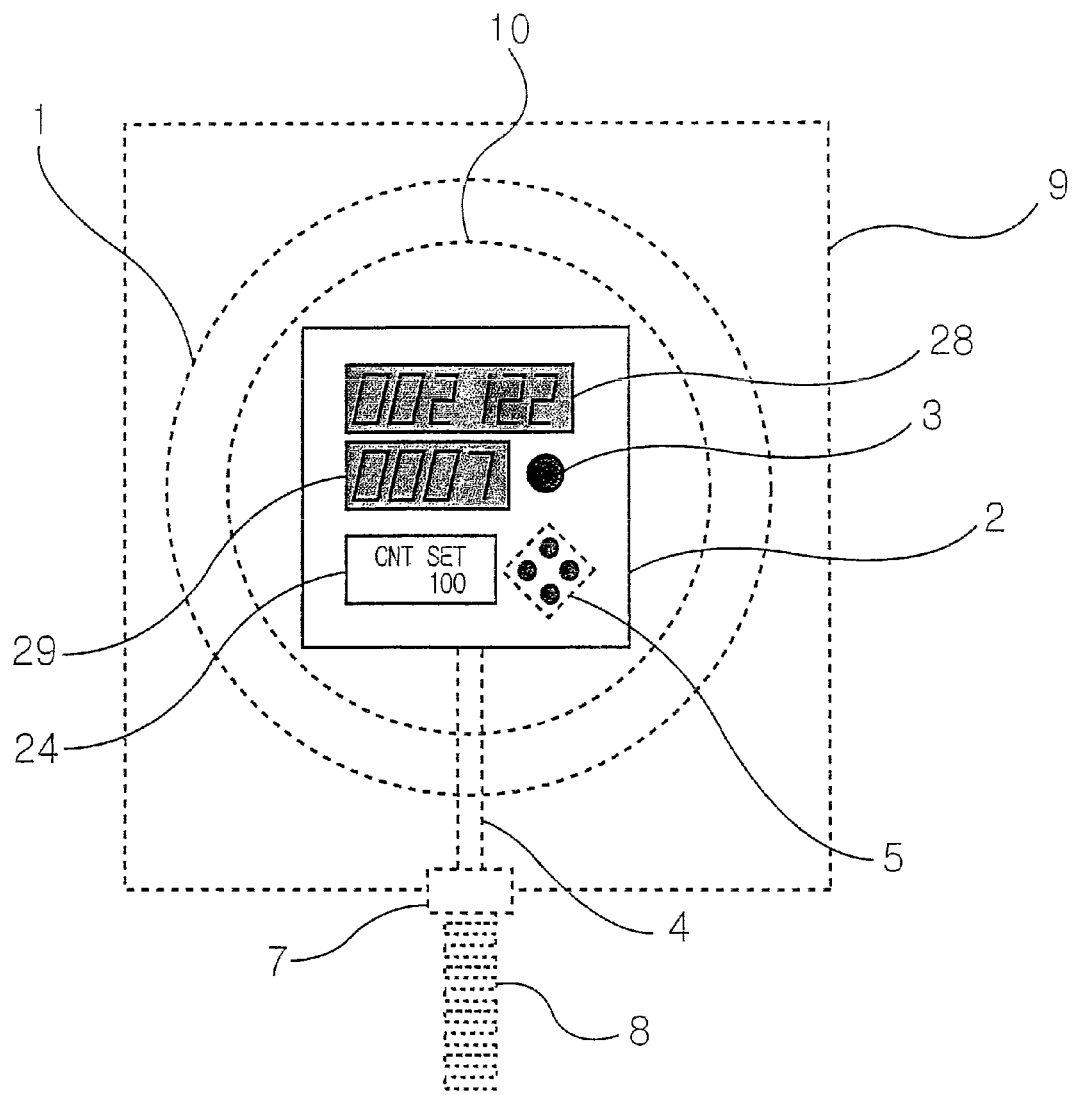
FIG. 6 is a front view showing the installation of the partial discharge counter of FIGS. 1 and 2.

FIG. 5 is a side view showing the installation of the partial discharge counter 2, and FIG. 6 is a front view showing the installation of the partial discharge counter 2. FIGS. 5 and 6 illustrate a structure connected to an existing partial discharge detection sensor 1. The partial discharge detection sensor 1 attached to the GIS is connected to the partial discharge counter 2 through a connector 6. The partial discharge detection sensor 1 is configured such that the outer portion of the sensor is inserted into a housing 9 to implement a waterproofing and damp-proofing structure. The front of the partial discharge counter is made of a transparent acryloyl 10 so as to view the count value obtained by the partial discharge counter, but the partial discharge counter has a damp-proofing structure to prevent the inside thereof from getting wet. A phase voltage 4 is input to the partial discharge counter 2 through a waterproofing pipe 8. The waterproofing pipe 8 is connected to the housing 9 through a waterproofing cap 7 to constitute a waterproofing structure in association with the housing 9. A resetting button 3 for clearing the partial discharge counter 2 and a setting button 5 for setting the partial discharge counter 2 are connected to the transparent acryloyl 10 in waterproofing form.

Hereinafter, a method of installing the partial discharge counter 2 of FIGS. 3 and 4 will be described in brief with reference to FIGS. 7 and 8.

Figure 7:
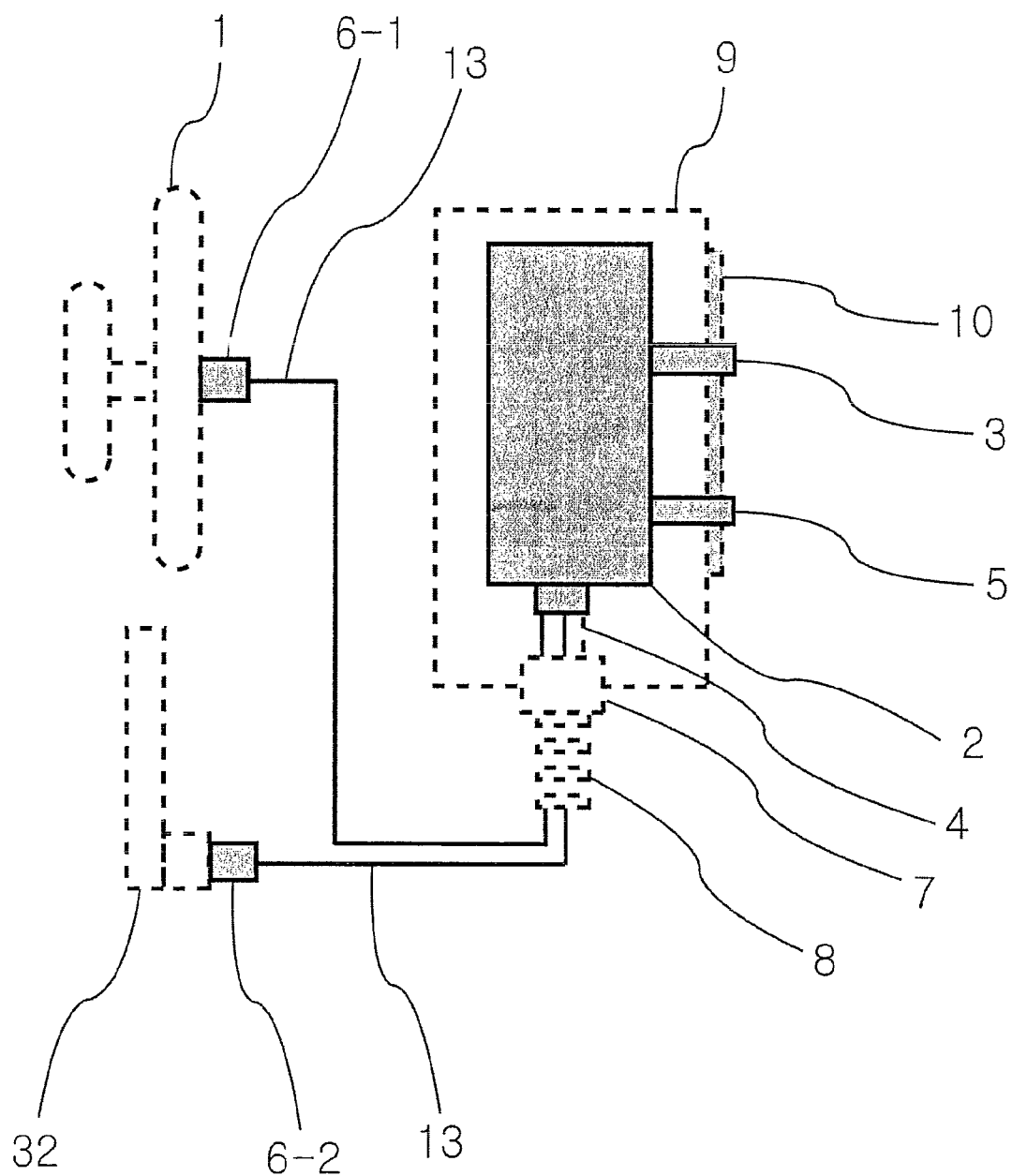
FIG. 7 is a side view showing the installation of the partial discharge counter of FIGS. 3 and 4.
Figure 8:
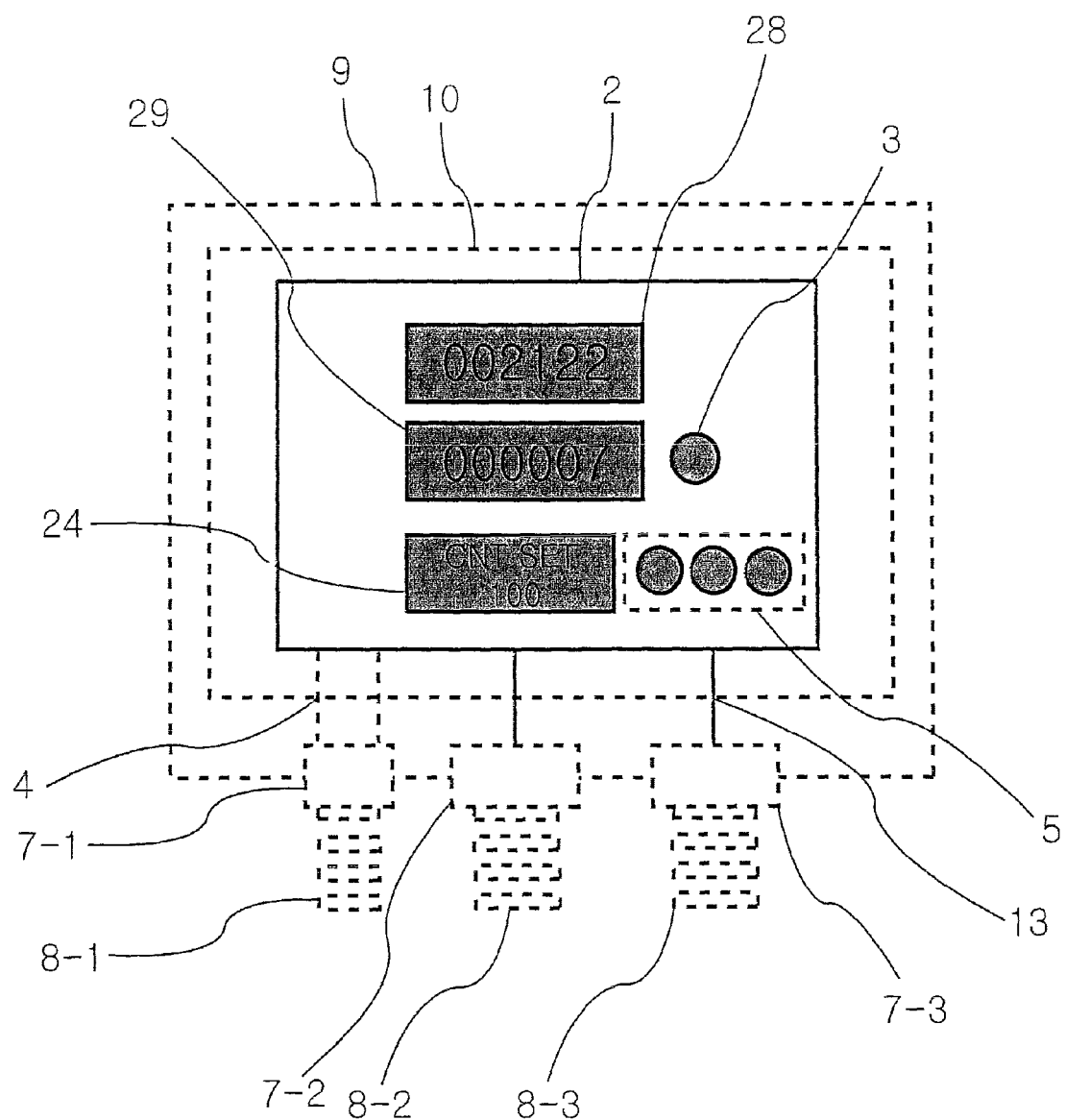
FIG. 8 is a front view showing the installation of the partial discharge counter of FIGS. 3 and 4.

FIG. 7 is a side view showing the installation of a partial discharge counter 2, and FIG. 8 is a front view showing the installation of the partial discharge counter 2. FIGS. 7 and 8 illustrate the partial discharge counter connected to an existing partial discharge detection sensor 1 and an existing noise detection sensor 32. FIG. 7 shows a structure identical to that of FIG. 5 except that a noise detection sensor 32 is additionally connected to the partial discharge counter 2 using a connector 6-2 in FIG. 5. Further, FIG. 8 shows a structure identical to that of FIG. 6 except that the coaxial cables 13 of the partial discharge detection sensor 1 and the noise detection sensor 32 are connected to the partial discharge counter 2 through their own waterproofing pipes 8-2 and 8-3. However, in order to emphasize that various modifications are possible, FIG. 8 shows a structure in which the transparent acryloyl 10 is formed in a rectangular shape and the setting button 5 is formed in a transverse arrangement.

The advantages of the present invention may be summarized as follows.

First, when a partial discharge detection method using a partial discharge detection sensor according to the present invention is used to diagnose a GIS system which is power supply equipment of a substation for the purpose of failure prevention, the number of times a partial discharge synchronized with a commercial frequency occurs is counted, and thus the present invention can replace the ordinary monitoring function of an online partial discharge diagnosis system which is complicated and expensive.

Second, since the GIS partial discharge counter according to the present invention can have a simple structure, can be implemented at low cost, and can be easily installed, it can be easily applied to work sites.

Third, since a reference level setting means is provided at the time of counting the number of times a GIS partial discharge occurs, the presence of a GIS partial discharge and the intensity of the partial discharge that occurs can be determined.

Fourth, at the time of counting the number of times a partial discharge occurs, a specific number of times a partial discharge occurs can be set to a count value '1' using a reference density setting means, thus preventing the loss of information attributable to excessive counting from occurring.

Fifth, since two counting units are provided, both the accumulated number of times a partial discharge occurs and the number of times a partial discharge has occurred for a predetermined period can be displayed at the time of counting the number of times the partial discharge of the GIS occurs. Thanks to this display method, when the number of times the GIS partial discharge occurs increases, notification of the fact that the degree of the partial discharge has increased is provided to an operator.

Sixth, since the malfunction of the partial discharge counter attributable to external noise can be prevented using two input signal channels, the number of times a partial discharge occurs can be more accurately counted.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A partial discharge counter device for diagnosis of a Gas Insulated Switchgear (GIS), the device measuring a number of times a partial discharge occurs in the GIS to perform diagnosis of insulation of the GIS, comprising:

a partial discharge detection sensor for detecting a partial discharge attributable to an abnormality inside the GIS when the partial discharge occurs;

a first surge inflow prevention circuit for separating a surge signal from an output terminal of the partial discharge detection sensor, thus protecting the counter device from the surge signal;

a channel 1 frequency conversion module for extracting a low-frequency component from a high-frequency output signal detected by the partial discharge detection sensor and forming a low-frequency signal;

a noise detection sensor for detecting noise when the noise occurs outside the GIS;

a second surge inflow prevention circuit for separating a surge signal from an output terminal of the noise detection sensor, thus protecting the counter device from the surge signal;

a channel 2 frequency conversion module for extracting a low-frequency component from a high-frequency output signal detected by the noise detection sensor and forming a low-frequency signal;

an Analog-Digital Counter (ADC) circuit for converting analog signals, output from the channel 1 frequency conversion module and the channel 2 frequency conversion module, into digital signals, and generating partial discharge data and noise data;

a synchronization device for dropping a phase voltage and converting the dropped phase voltage into a square wave signal, thus enabling the partial discharge data and the noise data, that is, output signals of the ADC circuit, to be output in synchronization with a frequency of the phase voltage;

a digital signal processing unit for comparing the synchronized partial discharge data and the noise data, determining whether a partial discharge has actually occurred, and counting a number of times the partial discharge occurs only when the partial discharges have actually occurred and exceed a set value; and counting units for displaying a count value obtained by the digital signal processing unit so as to allow a user to view the count value.

2. The partial discharge counter device according to claim 1, wherein each of the channel 1 frequency conversion module and the channel 2 frequency conversion module extracts a low-frequency component from a high-frequency output signal in an Ultra-High frequency (UHF)-band, detected from an input signal, using a band pass filter, detects only peak values and forms a low-frequency signal of several tens of kHz using a peak detection circuit, holds the peak values using a peak-hold circuit, and resets the peak-hold circuit through a peak reset circuit.

3. The partial discharge counter device according to claim 1, wherein the digital signal processing unit is connected to a warning unit for generating a warning.

4. The partial discharge counter device according to claim 1, wherein the digital signal processing unit is connected to a wired/wireless communication module for transmitting a count value to an external monitoring room via a wired or wireless connection.

5. The partial discharge counter device according to claim 1, wherein the counters comprise a reset counting unit for counting a number of times a partial discharge occurs for a predetermined period.

6. The partial discharge counter device according to claim 5, wherein the reset counting unit is configured such that the number of times the partial discharge occurs is initialized using a resetting button.

7. The partial discharge counter device according to claim 1, wherein the set value is a set reference level required to determine whether to count partial discharge signals based on magnitude of the partial discharge signals.

* * * * *